United States Patent
Kumar et al.

(10) Patent No.: US 9,290,671 B1
(45) Date of Patent: Mar. 22, 2016

(54) LOW COST SEMICONDUCTING ALLOY NANOPARTICLES INK AND MANUFACTURING PROCESS THEREOF

(71) Applicant: Oceanit Laboratories, Inc., Honolulu, HI (US)

(72) Inventors: Ashavani Kumar, Honolulu, HI (US); Vinod P. Veedu, Houston, TX (US)

(73) Assignee: Oceanit Laboratories, Inc., Honolulu, HI (US)

( * ) Notice: Subject to any disclaimer, the term of this patent is extended or adjusted under 35 U.S.C. 154(b) by 215 days.

(21) Appl. No.: 13/733,428

(22) Filed: Jan. 3, 2013

Related U.S. Application Data

(60) Provisional application No. 61/582,553, filed on Jan. 3, 2012.

(51) Int. Cl.
| | |
|---|---|
| *C09D 11/30* | (2014.01) |
| *C09D 11/00* | (2014.01) |
| *C09D 11/52* | (2014.01) |
| *C09D 11/02* | (2014.01) |
| *H01L 29/201* | (2006.01) |
| *H01L 29/221* | (2006.01) |
| *C30B 29/52* | (2006.01) |

(52) U.S. Cl.
CPC .............. *C09D 11/30* (2013.01); *C09D 11/00* (2013.01); *C09D 11/02* (2013.01); *C09D 11/52* (2013.01); *C30B 29/52* (2013.01); *H01L 29/201* (2013.01); *H01L 29/221* (2013.01)

(58) Field of Classification Search
None
See application file for complete search history.

(56) References Cited

U.S. PATENT DOCUMENTS

| | | | |
|---|---|---|---|
| 7,955,528 B2 | 6/2011 | Chung et al. |
| 7,977,240 B1 | 7/2011 | Rockenberger et al. |
| 8,012,378 B2 | 9/2011 | Kamikoriyama et al. |
| 8,039,107 B2 | 10/2011 | Asada et al. |
| 8,052,895 B2 | 11/2011 | Wu et al. |

(Continued)

FOREIGN PATENT DOCUMENTS

| | | | |
|---|---|---|---|
| CN | 101994156 A | * | 3/2011 |
| JP | 2000119575 A | * | 4/2000 |
| WO | WO 2009137637 A2 | * | 11/2009 |

OTHER PUBLICATIONS

English text abstract of Saida et al. (JP 2000-119575 A) accessed from the JPO database in EAST on Nov. 25, 2014 and attached to the case file.*

(Continued)

*Primary Examiner* — Khanh Tuan Nguyen
*Assistant Examiner* — Katie L Hammer
(74) *Attorney, Agent, or Firm* — James Creighton Wray; Meera P. Narasimhan

(57) ABSTRACT

Electronic printing devices ink has nanoparticles of semiconducting materials with desired composition, size and band gap and modified with a volatile capping agent. Mercury cadmium telluride is synthesized by refluxing a mixture of metal salt and telluride precursor. Mercury (II) acetate and cadmium (II) acetate are reacted with a tellurium precursor (e.g. tri-n-octylphosphine telluride or telluric acid) in presence of a ligand (e.g. 1-dodecanethiol or oleylamine). This protocol yields nanoparticles of diameter ~2-1000 nm range. The desired composition of nanoparticles is obtained by varying the relative concentration of the metal precursor. The ink is formulated by modifying the nanoparticles with volatile capping agent and dispersing the modified nanoparticles in a solvent.

9 Claims, 3 Drawing Sheets

(56) References Cited

U.S. PATENT DOCUMENTS

| | | | |
|---|---|---|---|
| 8,066,805 B2 | 11/2011 | Zurcher et al. | |
| 8,071,875 B2 | 12/2011 | Li | |
| 2005/0012182 A1* | 1/2005 | Jang | B82Y 10/00 257/613 |
| 2006/0028882 A1* | 2/2006 | Qu | B82Y 30/00 365/189.07 |
| 2007/0012355 A1* | 1/2007 | LoCascio | B82Y 20/00 136/252 |
| 2008/0001538 A1* | 1/2008 | Cok | B82Y 20/00 313/506 |
| 2010/0044636 A1* | 2/2010 | Ramprasad | C09K 11/883 252/301.6 S |
| 2010/0265307 A1* | 10/2010 | Linton et al. | 347/100 |

OTHER PUBLICATIONS

English text abstract of Cai et al. (CN 101994156 A), Derwent Acc-No: 2011-E90653, attached as a PDF.*

Sungwoo Kim, et al., Bandgap Engineered Monodisperse and Stable Mercury Telluride Quantum Dots and Their Application for Near-Infrared Photodetection, Journal of Materials Chemistry, Jul. 2011, pp. 15232-15236, vol. 21, The Royal Society of Chemistry.

Jaewon Chung, et al., Conductor Microstructures by Laser Curing of Printed Gold Nanoparticle Ink, Applied Physics Letters, Feb. 2004, pp. 801-803, vol. 84, No. 5, American Institute of Physics.

P.J. Smith, et al., Direct Ink-Jet Printing and Low Temperature Conversion of Conductive Silver Patterns, Journal of Materials Science, May 2006, pp. 4153-4158, vol. 41.

Ute Zschieschang, et al., Flexible Organic Circuits with Printed Gate Electrodes, Advanced Materials, Jul. 2003, pp. 1147-1151, vol. 15, No. 14.

Gregor G. Rozenberg, et al., Patterned Low Temperature Copper-Rich Deposits Using Inkjet Printing, Applied Physics Letters, Dec. 2002, pp. 5249-51, vol. 81, No. 27, American Institute of Physics.

Yun Hwan Jo, et al., Synthesis and Characterization of Low Temperature Sn Nanoparticles for the Fabrication of Highly Conductive Ink, Nanotechnology, Apr. 2011, pp. 1-8, vol. 22, IOP Publishing.

* cited by examiner

LOW COST SEMICONDUCTING ALLOY NANOPARTICLES INK AND MANUFACTURING PROCESS THEREOF

This application claims the benefit of U.S. Provisional Application No. 61/582,553, filed Jan. 3, 2012, which is hereby incorporated by reference in its entirety as if fully set forth herein.

BACKGROUND OF THE INVENTION

The fabrication of electronic devices has been carried out using photolithography process in conjunction with epitaxial growth techniques such as molecular beam epitaxy (MBE), metallo-organic chemical vapor deposition (MOCVD), liquid phase epitaxy (LPE) and isothermal vapor phase epitaxy (ISOVPE). These techniques have capability of producing multicomponent semiconductor epitaxial films with good radial compositional uniformity, surface morphology and electrical properties. However, the techniques suffer from several drawbacks such as expense, toxic waste, slow growth rate, skilled labor requirements, difficulty in controlling multi-elements in the film and requirement of sophisticated and expensive UHV equipment The direct printing technique is an inexpensive alternative to conventional vacuum deposition and photolithographic process.

Previous efforts of fabrication of electronic devices using ink jet printing are limited to polymer inks and inks having a few selected metals, such as tin, copper, silver, and gold.

Direct printing techniques have attracted considerable attention as an alternative to conventional vacuum deposition and photolithographic processes. Various functional films such as gate electrodes, gate dielectrics, source and drain contacts and active semiconductor layers have been printed recently.

Industry estimates project that printed electronics will be 35 percent of a $1.92 billion printed, thin film and organic electronics market. By 2020, the market could grow to $55.1 billion, with 71 percent printed electronics. While the development of printed electronics is in the early stages, it is evident that it has the potential to change the electronics industry.

The direct printing processes include micro contact printing ($\mu$-CP), nanoimprinting, solid state embossing, screen printing, drop-on-demand (DOD) inkjet printing and laser induced forward transfer (LIFT). Varieties of devices, such as RFID tags, LEDs, organic solar cells, organic thin-film transistors, and biomedical devices, have been fabricated using direct printing techniques showing the tremendous advancement in last few years.

Among all direct printing techniques, inkjet direct writing has emerged as the most attractive because of the ability of fully data driven and maskless drop-on-demand (DOD) inkjet processing. The key element of ink jet processing is to formulate inks and precursors that can be sprayed or printed with desired materials of proper composition and morphology and optical and electrical properties. So far, inkjet direct writing is limited to conducting polymers, tin, copper, silver and gold.

Currently, only metal based ink is commercially available. Examples of the metal based inks are Metalon JS-011 and JS-015 inks of Novacentrix, Ag 50P, Ag 60N and Cu NPs-based inkjet inks of Samsung ElectroMechanics, IJ 242-54 ink of Cima NanoTech.

Examples of metal ink patents are Kamikoriyama, et al. "Nickel ink" U.S. Pat. No. 8,012,378, Asada et al. "Silver-coated ball and method for manufacturing same" U.S. Pat. No. 8,039,107, Zurcher et al. "Metal inks, methods of making the same, and methods for printing and/or forming metal films" U.S. Pat. No. 8,066,805, Rockenberger et al. "Metal inks for improved contact resistance" U.S. Pat. No. 7,977,240, Chung et al. "Conductive inks and manufacturing method thereof" U.S. Pat. No. 7,955,528, Li et al. "Manufacture of thin solar cells based on ink printing technology" U.S. Pat. No. 8,071,875 and Wu et al. "Semiconducting ink formulation" U.S. Pat. No. 8,052,895.

Needs exist for new formulations and inks are required to realize the full potential of inkjet printing for manufacturing the inexpensive electronic devices.

SUMMARY OF THE INVENTION

The invention provides ink having multicomponent semiconducting nanomaterial such as mercury cadmium telluride, mercury zinc telluride, copper indium selenide, etc.

The ink is a key element of printing processing that can be sprayed or printed with desired materials, composition, optical and electrical properties. In the invention, ink is composed of nanoparticles of semiconducting materials with desired composition, size and band gap and modified with volatile capping agent. Synthesis protocol of nanoparticles is as follows:

The new ink of the invention can be used in any existing direct printing process including all of the direct printing processes described in the Background of the Invention. The new ink can be used in facilitating other direct printing processes.

Synthesis of Semiconducting Nanomaterial:

The nanoparticles are synthesized by a chemical route. For example, mercury cadmium telluride is synthesized by refluxing a mixture of metal salt and telluride precursor. In the synthesis process, mercury (II) acetate and cadmium (II) acetate are reacted with a tellurium precursor (e.g. tri-n-octylphosphine telluride or telluric acid) in presence of a ligand (e.g. 1-dodecanethiol or oleylamine). This protocol yields nanoparticles of diameter ~2-1000 nm range. The desired composition of nanoparticles is obtained by varying the relative concentration of the metal precursor. This chemical method yields nanoparticles of well-defined band gap and electrical conductivity.

The ink is formulated by modifying the nanoparticles with volatile capping agent and dispersing the modified nanoparticles in an appropriate solvent at high concentration. The modification of nanoparticles is carried out by a ligand exchange method involving refluxing the nanoparticles in a volatile capping agent such as pyridine, furon etc. The volatile capping agent replaces dodecanethiol/oleylamine ligand present on the nanoparticles surface. The capping agent prevents the nanoparticles from aggregation as well as makes them compatible with the dispersing medium.

Finally, the modified nanoparticles are dispersed in an appropriate solvent, such as hexane, methanol, pyridine, water/ethanol mixture, glycol etc.

The resultant ink is used for fabrication of electronic circuits and devices, e.g. sensors, detectors and energy conversion devices, using printing techniques such as micro contact printing ($\mu$-CP), nano-imprinting, solid state embossing, screen printing, drop-on-demand (DOD) inkjet printing and laser induced forward transfer (LIFT).

The key element of printing processing is to formulate inks/precursors that can be sprayed or printed with desired materials of proper composition, morphology, optical and electrical properties. So far, currently available ink is limited to conducting polymers, and metal such as tin, copper, silver, nickel and gold.

New formulations and inks have semiconducting multi-component systems. Applicant is formulating new multicomponent ink such as $Hg_{1-x}Cd_xTe$ (MCT), $Hg_{1-x}Zn_xTe$ metal selenide etc., which extend the printing process to wide ranges of electronic devices and circuits.

This new technology has commercial value in the area of electronic, energy and military application This invention provides technical problem solutions, including synthesis of nanoparticles of desired composition, size and well defined band-gap, easy, inexpensive and scalable manufacturing process, ideal solvents for printing, and appropriate chemical functionality for fabrication of devices and circuits on wide ranges of substrates such as, for example, silicon, polymer film, ceramics and textile.

One example of the invention provides development of mercury cadmium telluride ink, fabrication of devices using ink-jet printing, and performance evaluation and characterization of devices.

Developing a MCT ink extends the application of ink-jet printing for wide range of electronic devices such as sensors, detectors or energy conversion devices. Unlike conventional approaches, inkjet printing is capable of fabrication on plastic or polymer substrates which opens new avenues of futuristic flexible electronics.

The invention provides a solution of MCT (Hg1-xCdxTe) ink formulated and used to fabricate inexpensive, flexible electronic devices.

The invention includes synthesis of MCT nanoparticles, ligand exchange with volatile capping agents, high content of MCT in the ink, and good wetting and continuous pattern on the substrate. The invention includes developing MCT ink, fabrication of electronic devices and characterization and evaluation of device performance. Fabrications of MCT devices for wide range applications targeted to the military are included.

These and further and other objects and features of the invention are apparent in the disclosure, which includes the above and ongoing written specification, with the claims and the drawings.

DETAILED DESCRIPTION OF THE INVENTION

As an example of the new inks, mercury cadmium telluride Hg1-xCdxTe (MCT) is considered technologically important material due to its outstanding fundamental properties such as high optical absorption coefficient, high electron mobility, low thermal carrier generation rate and tunable band gap. It is a low band gap semiconductor material, highly sensitive to infrared radiation in mid-wave infrared window (3-5 µm) and long-wave window (8-12 µm) which make it an excellent material for infrared detectors. During the past 2-3 decades, MCT has found widespread applications as infrared detectors for military night vision goggles 10, sensors for airborne smart bombs and heat-seeking missiles 11, space and industrial systems such as Fourier transform infrared spectrometers 12 as shown in FIG. 1 and major research telescopes including several satellites.

Figure 1:
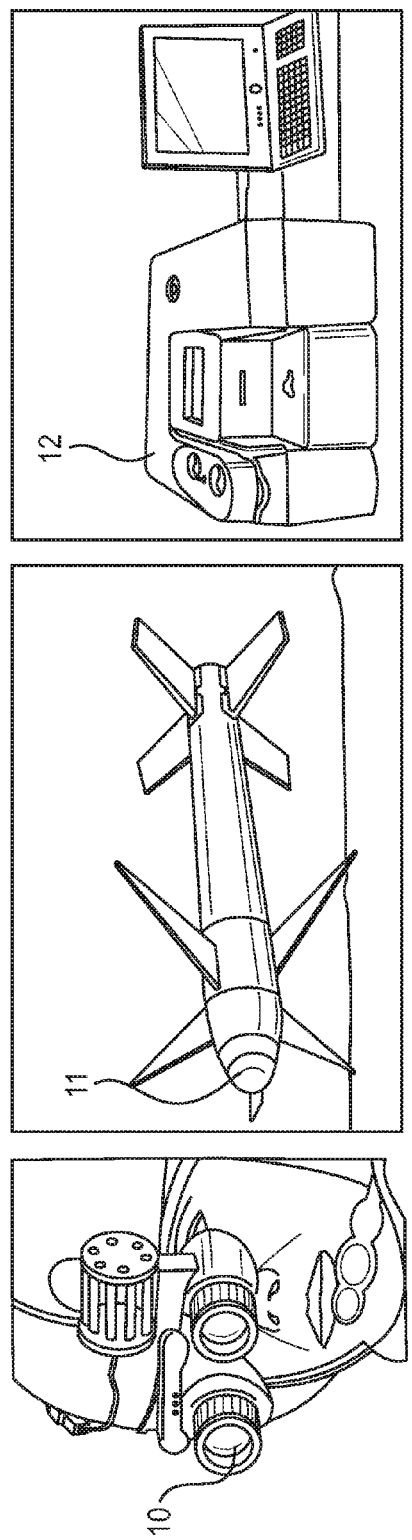
FIG. 1 shows several applications of the new inks of the invention including Hg1-xCdxTe (MCT) ink.

FIG. 1 shows application of Hg1-xCdxTe (MCT) in night vision goggles 10, heat sink missile 11 and detectors in FTIR spectrometers 12.

Hg1-xCdxTe (MCT) is an alloy of cadmium telluride (CdTe) and mercury telluride (HgTe). CdTe is a semiconductor with a band gap of ~1.5 eV at room temperature. HgTe is a semimetal; hence its band gap energy is zero. Therefore, the band gap of MCT can be tuned from 0 to 1.5 eV by mixing the both component (0<x<1) to achieve the peak responses in the two atmospheric transmission windows, 3-5 µm and 8-14 µm. Several bulk and epitaxial growth techniques have been developed to synthesize crystalline thin films of MCT with precise chemical compositions and high crystalline properties. Among the epitaxial techniques, molecular beam epitaxy (MBE), metallo-organic chemical vapor deposition (MOCVD), liquid phase epitaxy (LPE) and isothermal vapor phase epitaxy (ISOVPE) are the most commonly used techniques worldwide. These techniques have capability of producing MCT epitaxial films with good radial compositional uniformity, surface morphology and electrical properties. However, the techniques suffer from several drawbacks and problems such as toxic waste, slow growth rate required skilled labor, difficulty to control multi-elements in the films, and requirements of sophisticated and expensive UHV equipment. Additionally, those techniques have been used in conjunction with photolithography processes which include numbers of bakings at specific temperatures and several wet or dry etching steps.

MCT is soft and highly sensitive to temperature. Therefore many challenges are imposed in fabrication devices using conventional photolithography and epitaxial methods. MCT has been grown primarily on silicon substrates consisting large lattice mismatches (~19%) that affect the quality of MCT film. To overcome the mismatches, buffer layers of other materials such as ZnTe and CdTe are required on silicon wafers prior to growth of MCT. Those requirements add up several steps of Molecular beam epitaxy and annealing processes resulting in increases of costs to make those devices. Novel, simple and inexpensive fabrication process solutions are required for mercury cadmium telluride (Hg1-xCdxTe) based devices.

Figure 2A:
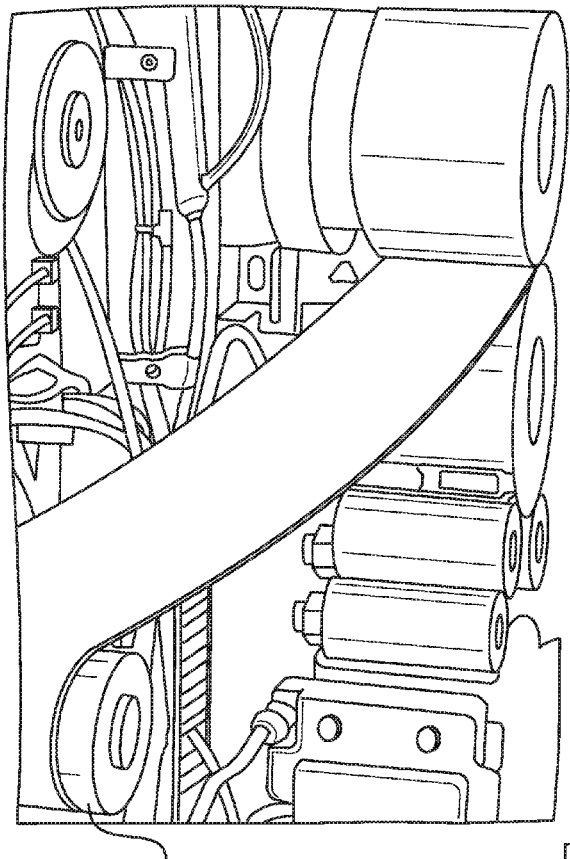
FIG. 2 shows an example of mass production of transistors printed on PET-foil, a coated flexible display and a solar cell on paper.
Figure 2B:
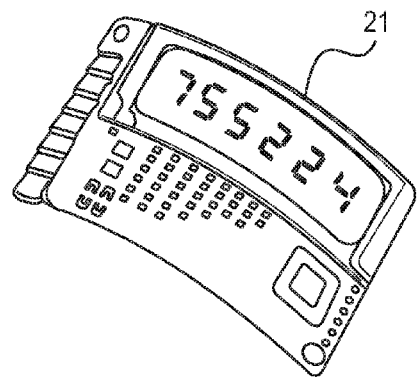
Figure 2C:
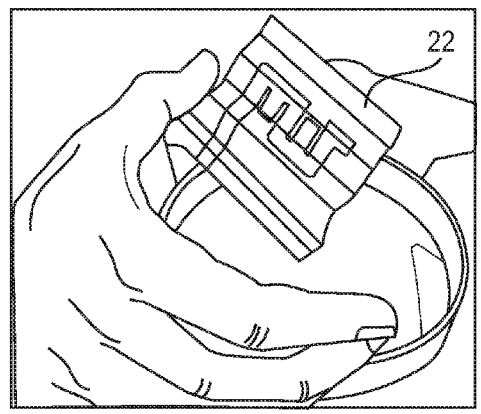

FIG. 2 shows mass production of transistors printed on PET-foil 20, coated flexible display 21 and a solar cell on paper 22.

The invention provides a solution of MCT (Hg1-xCdxTe) ink formulated and used to fabricate inexpensive, flexible electronic devices.

Figure 3:
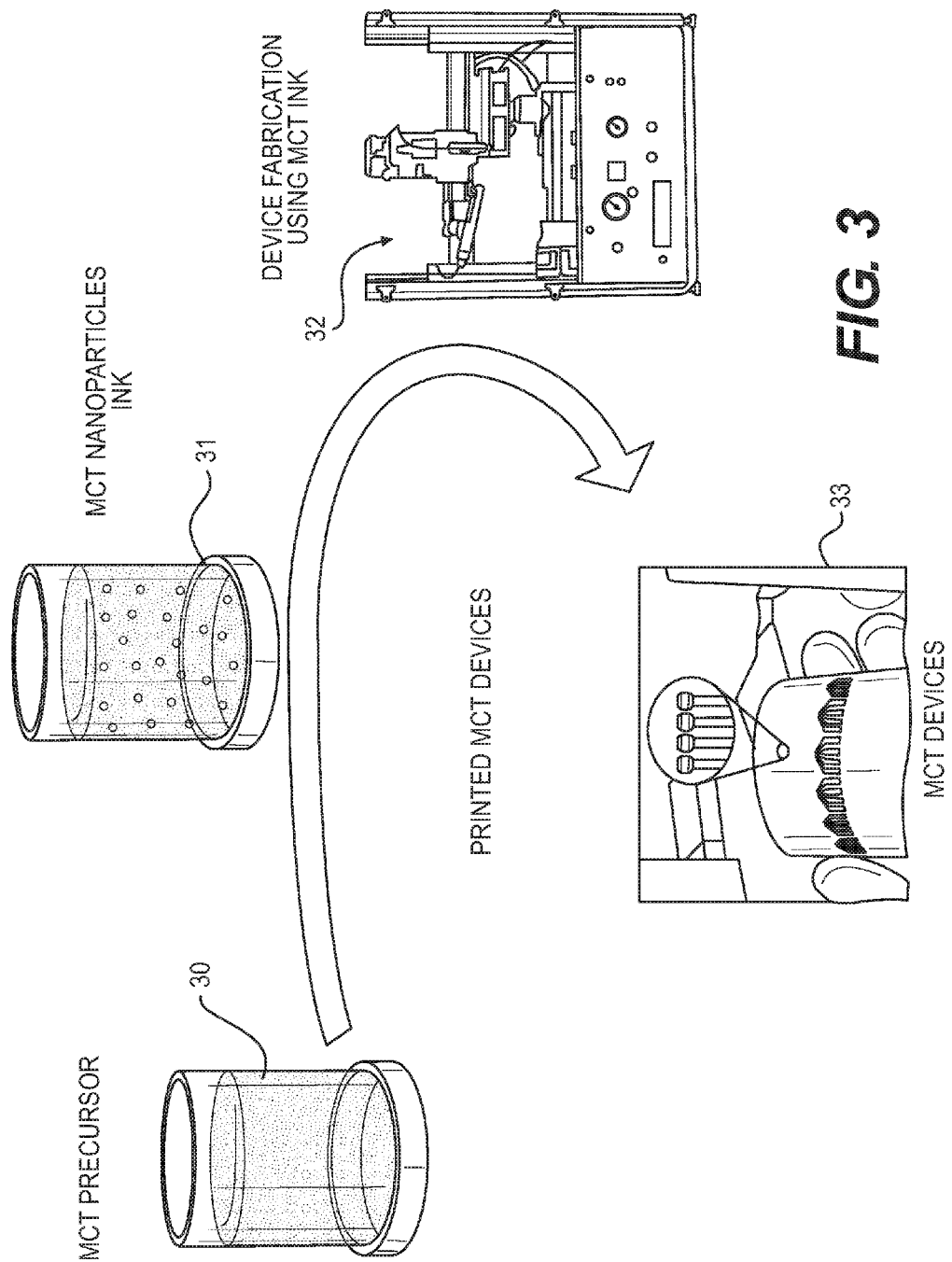
FIG. 3 shows the new ink fabrication of devices with new inks, including MCT.

FIG. 3 shows the fabrication of MCT devices. The novel approach develops an inexpensive, scalable ink-jet printing technique for fabrication of Hg1-xCdxTe (MCT) based devices. The new process involves synthesis 30 of MCT nanoparticles dispersion by wet chemicals. The ink 31 is formulated by functionalization of MCT nanoparticles with volatile capping agent and optimization of MCT nanoparticles concentration in a dispersion medium. The Ink is used for printing 32 electronic devices on wide ranges of materials such as silicon wafers and glass or plastic circuit boards 33.

The MCT nanoparticles are synthesized 30 by reaction of mercury(II) chloride and cadmium (II) chloride and tri-n-octylphosphine telluride in an inert atmosphere as described in Kim, S. et al., Mater. Chem; 21, 15232, 2011. In typical synthesis processes, mercury(II) acetate and cadmium (II) acetate are refluxed with tri-n-octylphosphine telluride in presence of ligand (e.g. 1-dodecanethiol or oleylamine). The synthesis protocol is scalable and yields nanoparticles of diameter ~10-50 nm range. The desired composition of nanoparticles is obtained by varying the relative concentration of metal precursor. This chemical method yields nanoparticles of well-defined band gap and electrical conductivity as required for applications. The nanoparticles ink 31 is synthesized by ligand exchange, involving refluxing nanoparticles in pyridine. The pyridine replaces dodecanethiol, oleylamine ligand present on the nanoparticles surfaces. Pyridine prevents the nanoparticles from aggregation as well as makes them compatible with the dispersing medium. The ink 31 is formulated by dispersing nanoparticles in appropriate solvent at high concentration. By optimizing the nanoparticles size, chemical functionality and appropriate solvent, the ink has the correct performance characteristics to 'jet' from the print head, interacts with the substrate to create wetting in the desired manner, and withstands the final processing and performance conditions for which the ink and the substrate are destined.

Devices are fabricated using drop-on-demand (DOD) piezoelectric ink-jet nozzle (orifice size=50 µm) manufactured by MicroFab Technologies. In a typical process, uniform droplet ejection is achieved by applying a 10 µs, 30V pulse at a frequency of 1000 Hz. Devices are printed on silicon wafers. The devices are characterized and their performance is evaluated. The final formulation, such as the size of the nanoparticles, the composition and concentration of nanoparticles and the chemical functionality, is further refined based on the performance of devices. The new process is a simple, inexpensive and scalable process for fabrication of MCT and other new ink based devices.

While the invention has been described with reference to specific embodiments, modifications and variations of the invention may be constructed without departing from the scope of the invention, which is defined in the following claims.

We claim:

1. A method comprising producing a multicomponent ink from II-VI or III-V semiconducting materials, the ink further comprising mercury cadmium telluride, zinc, copper, indium or selenide and combinations thereof, comprising producing semiconducting alloy nanoparticles of the II-VI or III-V semiconducting materials by refluxing wet dispersions of metal salts and metal acid in a high boiling point solvent in the presence of a ligand and forming ligand-coated metal alloy semiconducting nanoparticles, modifying the semiconducting alloy nanoparticles with a volatile capping agent to prevent the semiconducting alloy nanoparticles from aggregating and then dispersing the semiconducting alloy nanoparticles in a solvent, and printing or spraying the semiconducting alloy nanoparticles in the solvent to form electronic devices.

2. The method of claim 1, wherein the II-VI or III-V semiconducting alloy nanoparticles further comprise mercury cadmium telluride, mercury zinc telluride or copper indium selenide or their combination.

3. The method of claim 1, further comprising chemically synthesizing the semiconducting alloy nanoparticles by refluxing the metal salts and an element precursor in the presence of the ligand.

4. The method of claim 3, wherein the semiconducting alloy nanoparticles have a range of about 2-1000 nm and have desired band gap and electrical conductivity.

5. The method of claim 1, wherein the multicomponent ink semiconductor material comprises mercury cadmium telluride.

6. The method of claim 5, wherein the mercury cadmium telluride nanoparticles are synthesized by refluxing a mixture of metal salts and a telluride precursor in high boiling point solvent in the presence of a ligand, wherein the modifying the nanoparticles with a volatile capping agent further comprises replacing the ligand with the volatile capping agent before dispersing the modified nanoparticles in the solvent.

7. The method of claim 5, wherein the capping agent are heterocyclic compounds selected from the group consisting of pyridine, pyrrole, furon, and combinations thereof, which replaces the ligand, prevents the nanoparticles from aggregating and makes the nanoparticles compatible with the solvent which comprises hexane, water/ethanol mixture or glycol.

8. An article of manufacture comprising a substrate bearing an electronic device printed with an ink produced by the method of claim 1.

9. The method of claim 6, wherein the telluride precursor is telluric acid, the high boiling point solvent is tri-n-octylphosphine, and the ligand is 1-dodecanethiol or oleylamine.

* * * * *